United States Patent
Cao et al.

(10) Patent No.: US 10,763,574 B2
(45) Date of Patent: Sep. 1, 2020

(54) DISPLAY DEVICE, COLOR FILTER SUBSTRATE, MOBILE TERMINAL AND DRIVING METHOD THEREOF

(71) Applicant: BOE TECHNOLOGY GROUP CO., LTD., Beijing (CN)

(72) Inventors: Xueyou Cao, Beijing (CN); Jing Lv, Beijing (CN); Haisheng Wang, Beijing (CN); Chun Wei Wu, Beijing (CN); Xiaoliang Ding, Beijing (CN); Yingming Liu, Beijing (CN); Chih Jen Cheng, Beijing (CN); Yanling Han, Beijing (CN); Wei Liu, Beijing (CN); Weibing Gong, Beijing (CN); Ping Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/301,621

(22) PCT Filed: Mar. 16, 2018

(86) PCT No.: PCT/CN2018/079346
§ 371 (c)(1),
(2) Date: Nov. 14, 2018

(87) PCT Pub. No.: WO2018/205747
PCT Pub. Date: Nov. 15, 2018

(65) Prior Publication Data
US 2019/0198979 A1    Jun. 27, 2019

(30) Foreign Application Priority Data

May 12, 2017   (CN) .......................... 2017 1 0334886

(51) Int. Cl.
*H01Q 1/00* (2006.01)
*H01Q 1/24* (2006.01)
(Continued)

(52) U.S. Cl.
CPC ....... *H01Q 1/243* (2013.01); *G02F 1/133512* (2013.01); *G02F 1/133514* (2013.01);
(Continued)

(58) Field of Classification Search
CPC ............ H01Q 1/243; H01Q 1/38; H01Q 1/44; H01Q 21/06; H01Q 21/08; H01Q 9/0407;
(Continued)

(56) References Cited

U.S. PATENT DOCUMENTS 6,639,555 B1 * 10/2003 Kane ........................ H01Q 1/32
343/700 MS
2012/0169548 A1    7/2012 Yang
(Continued)

FOREIGN PATENT DOCUMENTS

| CN | 101105839 A | 1/2008 |
|---|---|---|
| CN | 101308266 A | 11/2008 |

(Continued)

OTHER PUBLICATIONS

First Chinese Office Action dated Jun. 5, 2019.
International Search Report and Written Opinion dated Jul. 4, 2018 from State Intellectual Property Office of the P.R. China.

*Primary Examiner* — Khai M Nguyen
(74) *Attorney, Agent, or Firm* — Dilworth & Barrese, LLP.; Michael J. Musella, Esq.

(57) ABSTRACT

A display device, a color filter substrate, a mobile terminal and a driving method thereof are provided. The display device includes a first substrate, provided with a drive device array for controlling display; a second substrate opposite to the first substrate, with a shield layer disposed on a side of (Continued)

the second substrate facing the first substrate; and an antenna device on the second substrate, located on a side of the shield layer away from the first substrate.

14 Claims, 4 Drawing Sheets

(51) Int. Cl.

| | |
|---|---|
| *G02F 1/1335* | (2006.01) |
| *H05K 1/18* | (2006.01) |
| *H01Q 21/06* | (2006.01) |
| *H01Q 1/38* | (2006.01) |
| *G06F 3/01* | (2006.01) |
| *H01Q 21/08* | (2006.01) |
| *H01Q 1/44* | (2006.01) |
| *H01Q 9/04* | (2006.01) |

(52) U.S. Cl.
CPC ............... *G06F 3/017* (2013.01); *H01Q 1/38* (2013.01); *H01Q 1/44* (2013.01); *H01Q 21/06* (2013.01); *H01Q 21/08* (2013.01); *H05K 1/189* (2013.01); *H01Q 9/0407* (2013.01)

(58) Field of Classification Search
CPC ......... G02F 1/133512; G02F 1/133514; G06F 3/017; H05K 1/189
See application file for complete search history.

(56) References Cited

U.S. PATENT DOCUMENTS

| | | | |
|---|---|---|---|
| 2013/0328732 | A1 | 12/2013 | Shimizu |
| 2016/0093939 | A1 | 3/2016 | Kim et al. |
| 2017/0131395 | A1* | 5/2017 | Reynolds ............... G01S 13/003 |
| 2019/0220136 | A1* | 7/2019 | Kurasawa ............. G06F 3/0412 |

FOREIGN PATENT DOCUMENTS

| | | |
|---|---|---|
| CN | 101598790 A | 12/2009 |
| CN | 102280701 A | 12/2011 |
| CN | 102569989 A | 7/2012 |
| CN | 103728906 A | 4/2014 |
| CN | 205029005 U | 2/2016 |
| CN | 205176504 U | 4/2016 |
| CN | 106950748 A | 7/2017 |
| JP | 2012248982 A | 12/2012 |
| WO | WO-2018062245 A1 * | 4/2018 |

\* cited by examiner

DISPLAY DEVICE, COLOR FILTER SUBSTRATE, MOBILE TERMINAL AND DRIVING METHOD THEREOF

The application claims priority of the Chinese patent application No. 201710334886.7, filed on May 12, 2017, the entire disclosure of which is incorporated herein by reference as part of the present application.

TECHNICAL FIELD

The disclosure relates to a display device, a color filter substrate, a mobile terminal and a driving method thereof.

BACKGROUND

With the rapid development of the wireless mobile communication technology, mobile terminal has ushered in changes again and again. With the development of the 4G communication technology, antenna device of mobile terminal for communication also needs to be reformed with the development of the communication technology. Currently, antenna of mobile terminal tends to be miniaturized, multi-functional, and stable. At the same time, the mobile terminal such as the mobile phone also tends to be light and thin, and multi-functional. For example, a current mobile phone can have functions such as gesture recognition in addition to the basic call function, and thus, size of the antenna required for the above-mentioned mobile terminal is also reduced, and the above-mentioned various types of communication functions of the mobile terminal are also required to be implemented.

SUMMARY

Some embodiments according to the present disclosure provide a display device, including: a first substrate, provided with a drive device array for controlling display; a second substrate opposite to the array substrate, a side of the second substrate facing the first substrate being provided with a shield layer; and an antenna device on the second substrate, located on a side of the shield layer away from the first substrate.

In some examples, the antenna device includes a plurality of transmitting terminals and a feed line connected to the plurality of the transmitting terminals.

In some examples, the antenna device further includes a hub terminal connected to the feed line.

In some examples, a material of the transmitting terminals includes a transparent conductive material.

In some examples, the second substrate includes a grid-shaped non-display region and a plurality of pixel regions defined by the non-display region, and an orthographic projection of the feed line on the second substrate is located within the non-display region, and a projection of the transmitting terminals on the second substrate is at least partially overlapped with the plurality of the pixel regions.

In some examples, the first substrate is an array substrate, the second substrate is a color filter substrate, the color filter substrate includes a black matrix located in the non-display region and a color filter layer located in the plurality of the pixel regions.

In some examples, the color filter substrate includes: a color filter base substrate, the shield layer is disposed on the color filter base substrate, and the color filter layer is located between the shield layer and the color filter base substrate; the antenna device is located between the color filter base substrate and the color filter layer, the antenna device is located between the shield layer and the color filter layer, or the antenna device is located on a side of the color filter base substrate away from the color filter layer.

In some examples, the plurality of the transmitting terminals includes the transmitting terminals with different sizes to achieve signal communications in different frequency bands.

In some examples, the display device further includes a flexible circuit board, and the flexible circuit board is connected with the feed line of the antenna device.

Some embodiments of the disclosure provide a color filter substrate, including: a color filter base substrate, a shield layer on the color filter base substrate and an antenna device, the antenna device is located between the shield layer and the color filter base substrate or located on a side of the color filter base substrate opposite to the shield layer.

In some examples, the antenna device includes a plurality of transmitting terminals and a feed line connected to the plurality of the transmitting terminals.

In some examples, a material of the transmitting terminals includes a transparent conductive material.

In some examples, the color filter substrate includes a grid-shaped non-display region and a plurality of pixel regions defined by the non-display region, and an orthographic projection of the feed line on the color filter substrate is located within the non-display region, and a projection of the transmitting terminals on the second substrate is at least partially overlapped with the plurality of the pixel regions.

In some examples, the color filter substrate further includes a black matrix located in the non-display region and a color filter layer located in the plurality of the pixel regions, wherein the color filter layer is located between the shield layer and the color filter base substrate; the antenna device is located between the color filter base substrate and the color filter layer, the antenna device is located between the shield layer and the color filter layer, or the antenna device is located on a side of the color filter base substrate away from the color filter layer.

Some embodiments of the disclosure provide a mobile terminal, including any one of the above-mentioned display devices.

Some embodiments of the disclosure provide a driving method of a mobile terminal, wherein the mobile terminal includes a display device, and the display device includes: a first substrate, provided with a drive device array for controlling display; a second substrate opposite to the array substrate, a side of the second substrate facing the first substrate being provided with a shield layer; and an antenna device on the second substrate, located on a side of the shield layer away from the first substrate, the method includes: querying a preset control strategy, and transmitting a control signal to the antenna device according to the preset control strategy, wherein the control signal is an electromagnetic wave, so as to achieve communication by using the antenna device.

In some examples, the communication includes performing at least two of the following methods performed in a time-sharing manner: applying a communication signal to the antenna device, and utilizing the antenna device to transmit the communication signal, so as to achieve a signal communication; applying a gesture recognition signal to the antenna device, utilizing the antenna device to transmit the gesture recognition signal, the gesture recognition signal acts on a gesture to be recognized to generate a gesture reflection signal, and utilizing a gesture recognition signal receiving device to receive the gesture reflection signal to achieve a gesture recognition; and applying a ranging signal to the antenna device, utilizing the antenna device to transmit the ranging signal, the ranging signal acts on an obstacle to generate a ranging reflection signal, and utilizing the a ranging signal receiving device to receive the ranging reflection signal to achieve a distance detection.

BRIEF DESCRIPTION OF THE DRAWINGS

In order to clearly illustrate the technical solution of the embodiments of the disclosure, the drawings of the embodiments will be briefly described in the following. It is obvious that the described drawings are only related to some embodiments of the disclosure and thus are not limitative of the disclosure.

The above-mentioned and/or additional aspects and advantages of the present disclosure will become apparent and readily understood from the description of the embodiments in combination with the following drawings.

REFERENCE NUMERALS

100: array substrate; 200: color filter substrate; 210: color filter base substrate; 220: pixel layer; 221: black matrix; 300: shield layer; 400: antenna device; 410: transmitting terminal; 420: feed line; 430: hub terminal; 500: flexible circuit board; 600: liquid crystal layer; 1000: display device; 1100: mobile terminal.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Inventor(s) of the present application has found that, antenna devices currently used for mobile terminals such as a mobile phone are generally difficult to be miniaturized and difficult to be multi-functional. After extensive study, the inventor(s) has found that, this is mainly because all of the antennas of the current mobile phone are fabricated on a printed circuit board (PCB). Thus, size of the whole mobile phone is increased, which results that a space of the mobile phone occupied by the antenna of the mobile phone is large, so that the requirement for a lighter and thinner mobile phone can not be satisfied. Furthermore, currently, function of the antenna device are relatively simple, thus, on the one hand, competitiveness of product is reduced, and on the other hand, if multiple communication functions of the mobile terminal are required, multiple antenna devices need to be provided, thereby further increasing the size of the whole mobile terminal.

Figure 1:
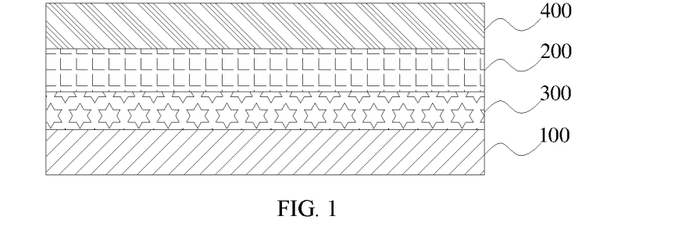
FIG. 1 shows a schematic structural view of a display device according to an embodiment of the disclosure.

According to an aspect of the disclosure, a display device is provided. Referring to FIG. 1, the display device includes an array substrate 100, a color filter substrate 200, a shield layer 300, and an antenna device 400. According to an embodiment of the disclosure, the color filter substrate 200 and the array substrate 100 are cell-assembled, and a side of the color filter substrate 200 facing the array substrate 100 is provided with the shied layer 300; and the antenna device 400 is disposed on a side of the shield layer 300 away from the array substrate 100. Thus, the antenna device 400 occupies a small space of the mobile phone, thereby reducing a size of the whole mobile phone, so that the whole mobile phone can be lighter and thinner. Those skilled in the art should understand that a liquid crystal layer (not shown) is further included between the color filter substrate 200 and the array substrate 100. After the color filter substrate 200 and the array substrate 100 are cell-assembled, the liquid crystal molecules are sealed in the liquid crystal layer to achieve a display function of the display device.

Hereinafter, the components of the display device are described in detail below according to detailed embodiments of the present disclosure.

Figure 2:
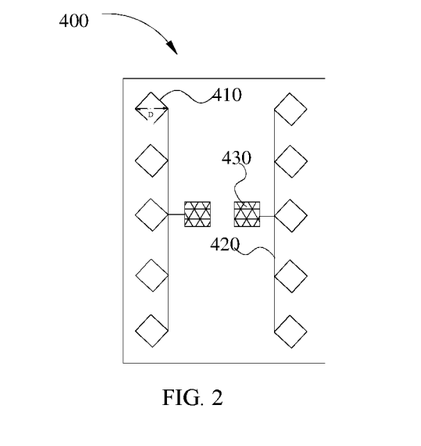
FIG. 2 shows a schematic structural view of an antenna device according to an embodiment of the disclosure.
Figure 3:
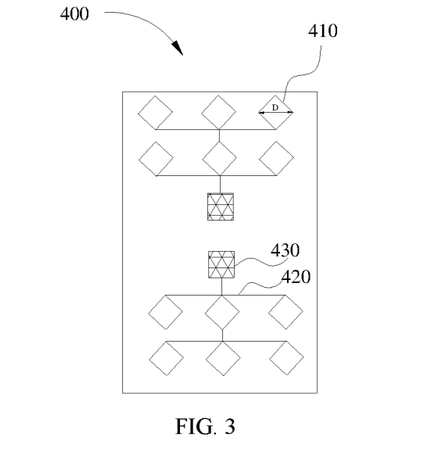
FIG. 3 shows a schematic structural view of an antenna device according to another embodiment of the disclosure.

According to an embodiment of the disclosure, referring to FIG. 2, the antenna device 400 includes a plurality of transmitting terminals 410, a feed line 420, and a hub terminal 430. The feed line 420 is connected to the plurality of the transmitting terminals 410; the hub terminal 430 is connected to the feed line 420. Thus, receiving and transmitting the electrical signals of the mobile terminal can be achieved. The plurality of the transmitting terminals 410 can be configured to transmit signals; the feeding wire 420 is configured to transfer the electrical signals; and the hub terminal 430 is connected to the feed line 420 to transfer signals to the plurality of the transmitting terminals 410. According to the embodiment of the disclosure, referring to FIGS. 2 and 3, the number and shape of the plurality of the transmitting terminals 410 are not particularly limited, as long as the plurality of the transmitting terminals can achieve the functions of the antenna device, and the number and shape of the plurality of the transmitting terminals 410 can be selected by those skilled in the art according to actual conditions. According to an embodiment of the disclosure, for example, the plurality of the transmitting terminals 410 can be diamond shaped electrode blocks. According to an embodiment of the disclosure, in order to increase the transmission power of the electrical signal and the gain of the antenna device, a diagonal length of the above-mentioned transmitting terminal 410 is one quarter of the wavelength of the electromagnetic wave transmitted by the antenna device 400. Those skilled in the art should understand that the size of the above-mentioned transmitting terminal 410 is obtained according to $V=\lambda \times f$, where V is an electromagnetic wave propagation speed, that is, the speed of light, which is $3\times10^8$ m/s, and f is obtained according to requirements. Thus, λ can be obtained by bring V and f into the formula. That is to say, the higher the frequency f of the electromagnetic wave used for the antenna device, the smaller the size of the antenna. For example, in a case where f=60 GHz, it can be obtained that the wavelength λ=0.005 m, that is, 5 mm, and the size of the antenna device is one quarter of the wavelength, that is, 1.25 mm Thus, the transmission power of the electromagnetic wave and the gain of the antenna can be improved, thereby further improving the performance of the display device. According to the embodiment of the disclosure, the arrangement of the plurality of the transmitting terminals 410 and the hub terminal 430 is not particularly limited, as long as the arrangement can achieve the function of the antenna 400. According to an embodiment of the disclosure, different antenna device arrays can be adopted according to the actual conditions, and at the same time, the antenna device array can be set according to the power of receiving and transmitting electrical signals of the desired antenna device and the gain of the antenna device. For example, referring to FIG. 2, the plurality of the transmitting terminals 410 and the hub terminal 430 can be arranged in a longitudinal array. It should be noted that, the number of columns of the longitudinal array in which the plurality of the transmitting terminals 410 are arranged is not particularly limited, and the number can be two, or can be four. A number of the plurality of the transmitting terminals 410 in each column is also not particularly limited, and the number can be five or seven. Referring to FIG. 3, the plurality of the transmitting terminals 410 and the hub terminal 430 can be arranged in a lateral array. It should be noted that, the number of rows of the lateral array in which the plurality of the transmitting terminals 410 are arranged is not particularly limited, and the number can be four or can be six. A number of the plurality of the transmitting terminals 410 in each row is not particularly limited, and the number can be three or five. The plurality of the transmitting terminals 410 are connected to the hub terminal 430 by the feed line 420, that is, the feed line 420 is configured to connect the plurality of the transmitting terminals 410, and is also configured to connect to the hub terminal 430 for transferring electrical signals.

According to an embodiment of the disclosure, the function of the antenna device is not particularly limited. For example, the antenna device can be a transmitting end. Those skilled in the art can understand that, in order to achieve the function of the antenna device, the display device can further include a receive antenna. The receive antenna can have a similar structure to the above-mentioned antenna device. The specific method of transmitting and receiving is not limited, and it can include one transmitting and two receiving, or two transmitting and four receiving.

Figure 4:
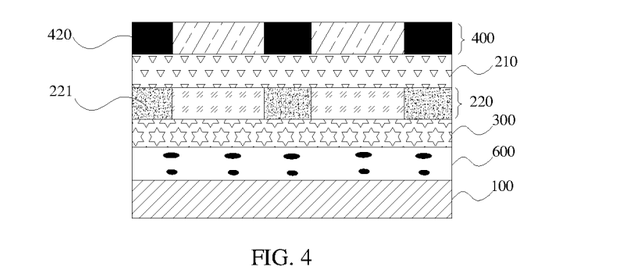
FIG. 4 shows a schematic structural view of a display device according to an embodiment of the disclosure.

According to an embodiment of the disclosure, referring to FIG. 4, the color filter substrate 200 further includes a color filter base substrate 210 and a pixel layer 220. Those skilled in the art should understand that a liquid crystal layer 600 is further included between the color filter substrate 200 and the array substrate 100. The shield layer 300 is disposed on the color filter base substrate 210, and the pixel layer 220 is disposed between the shield layer 300 and the color filter base substrate 210. The shield layer 300 is disposed on a side of the color filter substrate 200 facing the array substrate 100. The shield layer 300 separates the array substrate 100 from the color filter substrate 200. Thus, the antenna device 400 can be shielded from the signals of the host or the array substrate (having a circuit structure such as a thin film transistor array etc.) by the shield layer 300, to prevent the antenna device 400 from interfering with the above-mentioned signals. According to an embodiment of the disclosure, a specific material of the shield layer 300 is not particularly limited, and according to a detailed embodiment of the disclosure, a common electrode layer ($V_{com}$) can function as the shield layer 300, thereby avoiding additionally increasing a process for forming the shield layer, so as to save manufacturing costs and increase manufacturing efficiency.

According to an embodiment of the disclosure, the specific arrangement position of the antenna device 400 is not particularly limited, as long as the arrangement position of the antenna device 400 can utilize the shield layer 300 to shield the electrical signals such as the signals of the host etc., thereby avoiding affecting the function of the antenna device 400. The specific position of the antenna device 400 is described in detail below with reference to a detailed embodiment of the disclosure.

Figure 5:
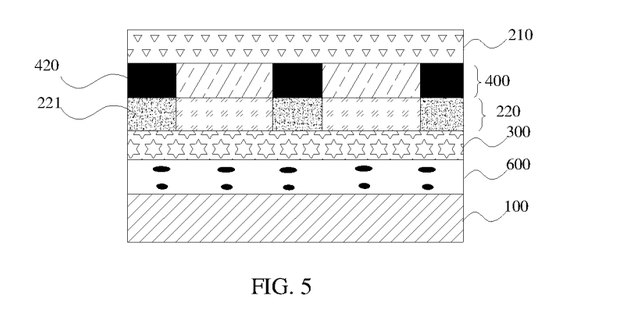
FIG. 5 shows a schematic structural view of a display device according to another embodiment of the disclosure.
Figure 6:
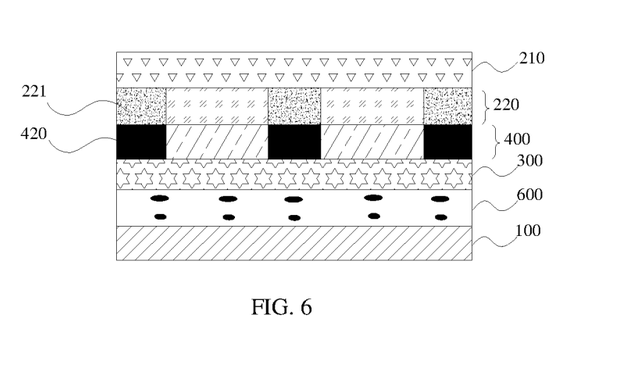
FIG. 6 shows a schematic structural view of a display device according to further another embodiment of the disclosure.

According to an embodiment of the disclosure, referring to FIG. 4, the antenna device 400 can be disposed on a side of the color filter base substrate 210 away from the pixel layer 220; referring to FIG. 5, the antenna device 400 can be disposed between the color filter base substrate 210 and the pixel layer 220; or referring to FIG. 6, the antenna device 400 can be disposed between the shield layer 300 and the pixel layer 220. According to the embodiment of the disclosure, all of the above-mentioned three disposing manners satisfy that the antenna device 400 is shielded from the signals of the host by the shield layer 300, thereby avoiding mutual interference between the antenna device 400 and the signals of the host. Alternatively, according to an embodiment of the disclosure, the antenna device 400 can also be integrated on a protective cover of the display device. Thus, it is advantageous to further reduce the thickness of the display device.

According to an embodiment of the disclosure, the specific material of the components of the antenna device 400 is not particularly limited. According to a detailed embodiment of the disclosure, in order not to affect the display of the display device, the plurality of the transmitting terminals 410 and the hub terminal 430 can be formed of a transparent conductive material. For example, the transmitting terminals 410 and the hub terminal 430 can be made of transparent ITO. Thus, the display effect of the display device will not be affected. The feed line 420 can be made of a metal wire.

Figure 7:
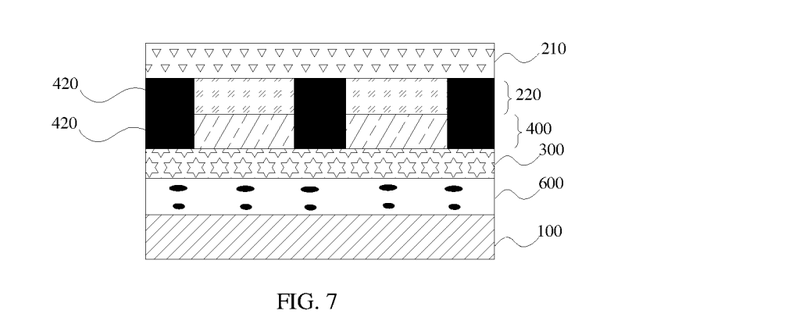
FIG. 7 shows a schematic structural view of a display device according to further another embodiment of the disclosure.

According to an embodiment of the disclosure, referring to FIG. 6, the color filter substrate 200 can further include a black matrix 221. A projection of the feed line 420 on the color filter substrate 200 coincides with the black matrix 221. Those skilled in the art should understand that, the black matrix 221 can be disposed in the pixel layer 220 for preventing light leakage. According to an embodiment of the disclosure, the feed line 420 is formed of an opaque metal, and the feed line 420 is disposed at a position corresponding to the black matrix 221, and the opaque black matrix 221 can be used to shield the feed line 420 formed of metal, so as to avoid affecting the display effect of the display device. Alternatively, according to an embodiment of the disclosure, referring to FIG. 7, the feed line 420 can be used to replace the black matrix 221, or the feed line 420 and the black matrix 221 are integrally formed to achieve the function of preventing light leakage. The black matrix 221 can be entirely replaced by the feed line 420, or can be partially replaced by the feed line 420, and thus the use of the black matrix 221 can be reduced while the performance of the antenna device can be achieved, thereby reducing the cost.

According to an embodiment of the disclosure, the manufacturing process of the feed line 420 is not particularly limited, as long as the manufacturing process can satisfy the function of the feed line 420. For example, it can be manufactured by using a deposition process.

Figure 8:
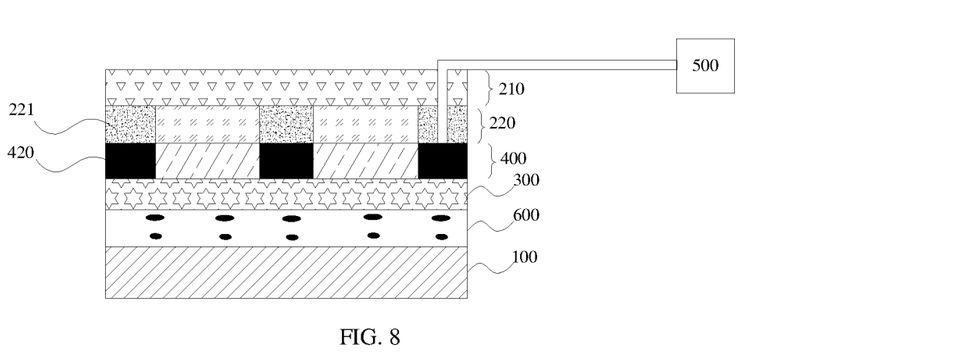
FIG. 8 shows a schematic structural view of a display device according to further another embodiment of the disclosure.

According to an embodiment of the disclosure, referring to FIG. 8, the above-mentioned display device further includes: a flexible circuit board 500. The flexible circuit board 500 is connected with the feed line 420 of the antenna device 400. According to an embodiment of the disclosure, the specific manner by which the flexible circuit board 500 is connected with the feed line 420 is not particularly limited, and for example, they can be bonded by a perforated connection, that is, the antenna device 400 is perforated to educe the electrical signals of the feed line 420 and connect to the flexible circuit board 500. Thus, the flexible circuit board 500 can communicate with the CPU (Central Processing Unit) to achieve the function of the antenna, so that the performance of the display device can be further improved.

According to an embodiment of the disclosure, the antenna device 400 can have various functions such as 4G communication, distance detection, and gesture detection etc. The implementation of the above-mentioned functions can be achieved by controlling the frequency of the signal transmitted by the antenna device 400. For example, in a case where the antenna device 400 is configured for the 4G communication, a communication signal can be transmitted by controlling the antenna device with the CPU. In a case where the antenna device is configured for the distance detection, a distance detection signal can be transmitted, and a reflection ranging signal can be detected by another receiving device to achieve the distance detection. According to a detailed embodiment of the disclosure, the antenna device 400 can also be partitioned. For example, the antenna device can be divided into an upper region, a middle region and a lower region, and a plurality of transmitting terminals connected to one or more feed line(s) in one region are configured to transmit the 4G communication signal, and a plurality of transmitting terminals in another region are configured to transmit the distance detection signal etc.

The above-mentioned embodiments illustrate an example in which the liquid crystal display device includes an array substrate and a color filter substrate. However, the embodiments according to the disclosure are not limited to this. The display device according to the disclosure can also include an organic light emitting diode display device. For example, the OLED display device includes an array substrate and a cover plate disposed opposite to the array substrate. In this case, the antenna device can be disposed on the cover plate and shielded from the array substrate by a shield layer. Accordingly, some embodiments of the disclosure provide a display device including a first substrate provided with a drive device array for controlling display (for example, the drive device herein can include a pixel electrode, a thin film transistor, etc.); a second substrate, disposed opposite to the array substrate, wherein a side of the second substrate facing the first substrate being provided with a shield layer; and an antenna device, disposed on the second substrate and located on a side of the shield layer away from the first substrate.

Further, with respect to the relationship between the above-mentioned black matrix and the feed line, because the feed line is disposed at a position corresponding to the black matrix, the aperture ratio of the display device will not be affected. The region where the black matrix is located is a grid-shaped non-display region. For example, the above-mentioned color filter substrate or second substrate includes a grid-shaped non-display region and a plurality of pixel regions defined by the non-display region, and an orthographic projection of the feed line on the second substrate is located within the non-display region, and a projection of the transmitting terminals on the second substrate is at least partially overlapped with the plurality of pixel regions. In some embodiments, because the feed line is generally formed of an opaque metal wire, the feed line and the black matrix can also be integrally formed into one body.

In summary, the display device has at least one of the following advantages: the space of the mobile phone occupied by the antenna device 400 is reduced, thereby reducing the size of the whole mobile phone, so that the mobile phone can be lighter and thinner; the configuration of the feed line 420 will not affect the display effect of the display device; and the shield layer 300 shields the antenna device 400 from the signals of the host to prevent the antenna device 400 from interfering with the signals of the host.

Figure 9:
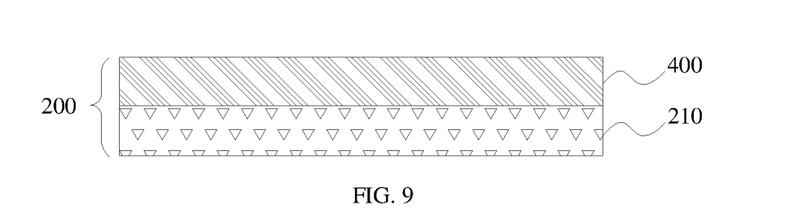
FIG. 9 shows a schematic structural view of a color filter substrate according to an embodiment of the disclosure.

In another aspect of the disclosure, referring to FIG. 9, the disclosure provides a color filter substrate 200. According to an embodiment of the disclosure, the color filter substrate 200 includes an antenna device 400. The antenna device 400 is the above-mentioned antenna device. Thus, the color filter substrate has all of the features and advantages of the above-mentioned antenna device 400, which will not be repeated herein.

Figure 10:
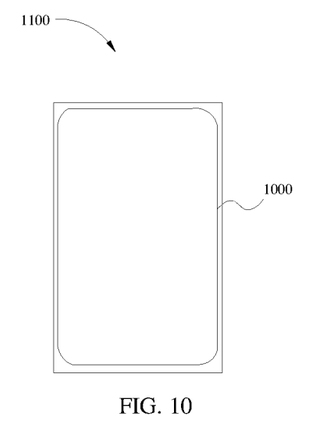
FIG. 10 shows a schematic structural view of a mobile terminal according to an embodiment of the disclosure.

In yet another aspect of the disclosure, referring to FIG. 10, the disclosure provides a mobile terminal 1100 which includes the above-mentioned display device 1000. Thus, the mobile terminal 1100 has all of the features and advantages of the above-mentioned display device 1000, which will not be repeated herein. In general, the mobile terminal 1100 has at least one of the following advantages: the space of the mobile phone occupied by the antenna device is reduced, thereby reducing the size of the whole mobile phone, so that the mobile phone can be lighter and thinner.

In still another aspect of the disclosure, the disclosure provides a driving method of a mobile terminal. According to an embodiment of the disclosure, the mobile terminal 1100 includes a display device 1000, which can be the above-mentioned display device. That is, the display device 1000 can include the array substrate 100, the color filter substrate 200, and the antenna device 400. According to an embodiment of the disclosure, the color filter substrate 200 and the array substrate 100 are cell-assembled, and the shield layer 300 is disposed on a side of the color filter substrate 200 facing the array substrate 100; and the antenna device 400 is disposed on a side of the shield layer 300 away from the array substrate 100. According to a detailed embodiment of the disclosure, the mobile terminal can be the above-mentioned mobile terminal, and thus the mobile terminal 1100 has all of the features and advantages of the above-mentioned mobile terminal 1100, which will not be repeated herein.

According to an embodiment of the disclosure, the driving method includes: querying a preset control strategy, and transmitting a control signal to the antenna device according to the preset control strategy, wherein the control signal is an electromagnetic wave, so as to achieve communication by using the antenna device. The driving method can achieve a multifunctional application of the antenna of the mobile terminal.

According to a detailed embodiment of the disclosure, the above-mentioned preset control strategy can include implementing at least two of the mobile communication, the gesture recognition, and the distance detection by using the antenna device. According to different preset control strategies, different electromagnetic wave control signals are transmitted to the antenna device to implement the various communication functions of the antenna device.

For example, a timing control can be performed on the antenna device. In a communication period, an electromagnetic wave signal for the communication is applied to the antenna device, and a communication signal is transmitted by the antenna device to achieve signal communication. In a gesture recognition period, an electromagnetic wave signal for the gesture recognition is applied to the antenna device, the gesture recognition signal is transmitted by the antenna device, the gesture recognition signal acts on a gesture to be recognized to generate a gesture reflection signal, and a gesture recognition signal receiving device receives the gesture reflection signal. According to an embodiment of the disclosure, a specific method of the gesture recognition is not particularly limited. In the gesture recognition, the antenna device transmits an electromagnetic wave signal for the gesture recognition, the electromagnetic wave signal for the gesture recognition acts on a gesture to be recognized to generate a reflection signal, and the antenna device receives the reflection signal. The reflection signal and a preset reflection signal are compared by a control device such as an integrated circuit (IC) etc., so that different gestures can be recognized and corresponding controls can be performed. For example, a double-click gesture can be performed to perform a screen wake-up function. In a distance detection period, a ranging signal is applied to the antenna device, the ranging signal is transmitted by the antenna device, the ranging signal acts on an obstacle to generate a ranging reflection signal, and a ranging signal receiving device receives the ranging reflection signal to achieve the distance detection. Thus, a plurality of functions can be achieved, the functions of the mobile phone antenna are diversified, and a time sharing control can be achieved. Those skilled in the art should understand that, the operation principle of the above-mentioned signal communication, gesture recognition, and distance detection is that the antenna device sends a modulated frequency signal, and the distance between an object and the mobile terminal is measured by the Doppler principle, and meanwhile the state information of the object can be read or the signal communication and gesture recognition can be achieved.

In the description of the disclosure, the orientation or position relationship of the terms "On", "Under", etc., is based on the orientation or position relationship shown in the drawings, and is merely for the convenience of describing the disclosure and not required that the disclosure must be constructed and operated in a specific manner, and thus cannot be construed as limiting the disclosure.

In the description of the specification, the description of the terms "one embodiment", "another embodiment" or the like refers to that the specific features, structures, materials or characteristics described in connection with the embodiment are included in at least one embodiment of the disclosure. In the specification, the schematic representation of the above terms is not necessarily directed to the same embodiment or example. Furthermore, the described particular features, structures, materials, or characteristics can be combined in a suitable manner in any one or more embodiment(s) or example(s). In addition, those skilled in the art can incorporate or combine various embodiments or examples described in the specification, as well as features of the various embodiments or examples, if they are not contradictory to each other. In addition, it should be noted that, in the specification, the terms "first" and "second" are merely used for descriptive purposes, and should not be understood as indicating or implying relative importance or implicitly indicating the number of designated technical features.

The foregoing is merely exemplary embodiments of the disclosure, but is not used to limit the protection scope of the disclosure. The protection scope of the disclosure shall be defined by the attached claims.

What is claimed is:

1. A display device, comprising:
    a first substrate, provided with a drive device array for controlling display;
    a second substrate opposite to the first substrate, a side of the second substrate facing the first substrate being provided with a shield layer; and
    an antenna device on the second substrate and located on a side of the shield layer away from the first substrate.

2. The display device according to claim 1, wherein the antenna device comprises a plurality of transmitting terminals and a feed line connected to the plurality of the transmitting terminals.

3. The display device according to claim 2, wherein the antenna device further comprises a hub terminal connected to the feed line.

4. The display device according to claim 3, wherein a material of the transmitting terminals comprises a transparent conductive material.

5. The display device according to claim 3, wherein the second substrate comprises a grid-shaped non-display region and a plurality of pixel regions defined by the non-display region, and an orthographic projection of the feed line on the second substrate is located within the non-display region, and a projection of the transmitting terminals on the second substrate is at least partially overlapped with the plurality of the pixel regions.

6. The display device according to claim 2, wherein a material of the transmitting terminals comprises a transparent conductive material.

7. The display device according to claim 2, wherein the plurality of the transmitting terminals comprises the transmitting terminals with different sizes to achieve signal communications in different frequency bands.

8. The display device according to claim 2, further comprising a flexible circuit board, wherein the flexible circuit board is connected with the feed line of the antenna device.

9. A mobile terminal, comprising the display device according to claim 1.

10. A driving method of the mobile terminal according to claim 9,
    comprising: querying a preset control strategy, and transmitting a control signal to the antenna device according to the preset control strategy, wherein the control signal is an electromagnetic wave, so as to achieve communication by using the antenna device.

11. The driving method according to claim 10, wherein the communication comprises performing at least two of following methods performed in a time-sharing manner:
    applying a communication signal to the antenna device, and utilizing the antenna device to transmit the communication signal, so as to achieve a signal communication;
    applying a gesture recognition signal to the antenna device, utilizing the antenna device to transmit the gesture recognition signal, the gesture recognition signal acts on a gesture to be recognized to generate a gesture reflection signal, and utilizing a gesture recognition signal receiving device to receive the gesture reflection signal to achieve a gesture recognition; and applying a ranging signal to the antenna device, utilizing the antenna device to transmit the ranging signal, the ranging signal acts on an obstacle to generate a ranging reflection signal, and utilizing a ranging signal receiving device to receive the ranging reflection signal to achieve a distance detection.

12. A display device, comprising:
a first substrate, provided with a drive device array for controlling display;
a second substrate opposite to the first substrate, a side of the second substrate facing the first substrate being provided with a shield layer; and
an antenna device on the second substrate and located on a side of the shield layer away from the first substrate,
wherein the antenna device comprises a plurality of transmitting terminals and a feed line connected to the plurality of the transmitting terminals, and
wherein the second substrate comprises a grid-shaped non-display region and a plurality of pixel regions defined by the non-display region, and an orthographic projection of the feed line on the second substrate is located within the non-display region, and a projection of the transmitting terminals on the second substrate is at least partially overlapped with the plurality of the pixel regions.

13. The display device according to claim 12, wherein the first substrate is an array substrate, the second substrate is a color filter substrate, the color filter substrate comprises a black matrix in the non-display region and a color filter layer in the plurality of the pixel regions.

14. The display device according to claim 13, wherein the color filter substrate comprises: a color filter base substrate, the shield layer is disposed on the color filter base substrate, and the color filter layer is located between the shield layer and the color filter base substrate;
the antenna device is located between the color filter base substrate and the color filter layer, the antenna device is located between the shield layer and the color filter layer, or the antenna device is located on a side of the color filter base substrate away from the color filter layer.

\* \* \* \* \*